United States Patent [19]

Jindrick

[11] 4,129,828
[45] Dec. 12, 1978

[54] OSCILLOSCOPE PRETRIGGER CIRCUIT
[75] Inventor: James A. Jindrick, Kenosha, Wis.
[73] Assignee: Snap-On Tools Corporation, Kenosha, Wis.
[21] Appl. No.: 837,636
[22] Filed: Sep. 28, 1977
[51] Int. Cl.² ............................................ G01R 13/42
[52] U.S. Cl. .................................................... 324/16 S
[58] Field of Search ........................ 324/16 S; 315/367
[56] References Cited
U.S. PATENT DOCUMENTS

| 4,010,415 | 3/1977 | Reeves et al. | 324/16 S |
| 4,010,419 | 3/1977 | Reeves et al. | 324/16 S |

Primary Examiner—Stanley T. Krawczewicz
Attorney, Agent, or Firm—Vogel, Dithmar, Stotland, Stratman & Levy

[57] ABSTRACT

The circuit includes a phase-locked loop that produces pulses a fixed number of engine degrees before the ignition signals. These pulses are used to initiate the horizontal sweep of an oscilloscope that displays the ignition pulses. Accordingly, the ignition signals commence not at the beginning of the display where useful information may be lost, but rather a predetermined number of engine degrees later.

9 Claims, 2 Drawing Figures

OSCILLOSCOPE PRETRIGGER CIRCUIT

BACKGROUND OF THE INVENTION

In order to evaluate engine performance, the ignition signals or pulses which sequentially fire the spark plugs of an internal combustion engine are evaluated. A number of malfunctions relating to ignition can be uncovered by viewing the ignition signals on an oscilloscope. In currently available oscilloscopes, the horizontal sweep is triggered simultaneously with the commencement of the ignition signal so that the ignition signal appearing on the oscilloscope screen commences at the left-hand side of the screen. There is or may be useful information between the end of one sweep and the commencement of the next sweep, which information is lost or at least not readily apparent on the screen. It has been found to be desirable to advance commencement of the horizontal sweep so that the start of the ignition signal is at some distance to the right of the left-hand side of the screen. Some employ a fixed time delay so that the sweep starts a predetermined time after the ignition signal. The disadvantage in this approach is that variations in engine speed will cause the ignition signal to appear at different places on the screen.

There have been several efforts to design a pretrigger circuit for an oscilloscope that takes into account any changes in the engine speed so that the display on the screen starts at a time irrespective of speed. For example, reference is made to U.S. Pat. No. 2,928,040 to Welcome, U.S. Pat. No. 2,985,011 to Sackett, U.S. Pat. Nos. 3,638,107 and 3,714,499 to Pelta et al. and U.S. Pat. No. 4,008,434 to Schaefer. The circuits disclosed in these patents do not insure constant location of the wave form on the face of the oscilloscope, with changes in engine speed and dwell.

SUMMARY OF THE INVENTION

It is therefore an important object of the present invention to provide an improved circuit for pretriggering the horizontal sweep of an oscilloscope in an engine analyzer.

Another object is to provide such a pretrigger circuit which automatically takes into account changes in engine speed so that the horizontal sweep commences at the same point on the oscilloscope face irrespective of engine speed.

Another object is to provide a pretrigger circuit that pretriggers the horizontal sweep of an oscilloscope slightly before the occurrence of the signal to be displayed so that on the one hand useful information is not lost and on the other hand the display is not moved so far so as to confuse the mechanic.

Another object is to provide a circuit for pretriggering an oscilloscope by an adjustable amount.

Another object is to provide a pretrigger circuit for the horizontal sweep of an oscilloscope by utilizing ignition signals available on either the primary or the secondary of the ignition coil.

Another object is to provide a pretrigger circuit for the oscilloscope of an engine analyzer which is independent of the amount of dwell angle.

In summary, there is provided a pretrigger circuit for the horizontal-sweep generator of an oscilloscope which is used to display ignition signals of an internal combustion engine, the trigger circuit comprising phase-comparator means having first and second inputs and an output, the first input being connected to receive the ignition signals, the phase-comparator means generating a control voltage representative of the difference in phase and frequency of two signals respectively applied to the first and second inputs, voltage-controlled oscillator means coupled to the output of the phase-comparator means for producing a sequence of oscillator pulses at a frequency within a range of frequencies generally centered at N times the frequency of the ignition signals, the frequency of the oscillator pulses being controlled by the value of the control voltage, and shift-register means having an input coupled to the voltage-controlled oscillator means and N shift-register outputs, one of the shift-register outputs being coupled to the second input of the phase-comparator means and another of the shift-register outputs being coupled to the horizontal-sweep generator, the sequence of oscillator pulses respectively causing the shift-register means to generate output pulses sequentially on the shift-register outputs, whereby the output pulses on the one shift-register output are at the same frequency as the ignition signals and are in phase therewith, and the output pulses on the other shift-register output are at the same frequency as the ignition signals but not in phase therewith so that horizontal sweeps of the oscilloscope commence at a selected point between the starts of the ignition signals.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the invention.

BRIEF DESCRIPTION OF THE DRAWINGS

For the purpose of facilitating an understanding of the invention, there is illustrated in the accompanying drawings, a preferred embodiment thereof, from an inspection of which, when considered in connection with the following description, the invention, its construction, and operation, and many of its advantages should be readily understood and appreciated.

DESCRIPTION OF THE PREFERRED EMBODIMENT

Figure 1:
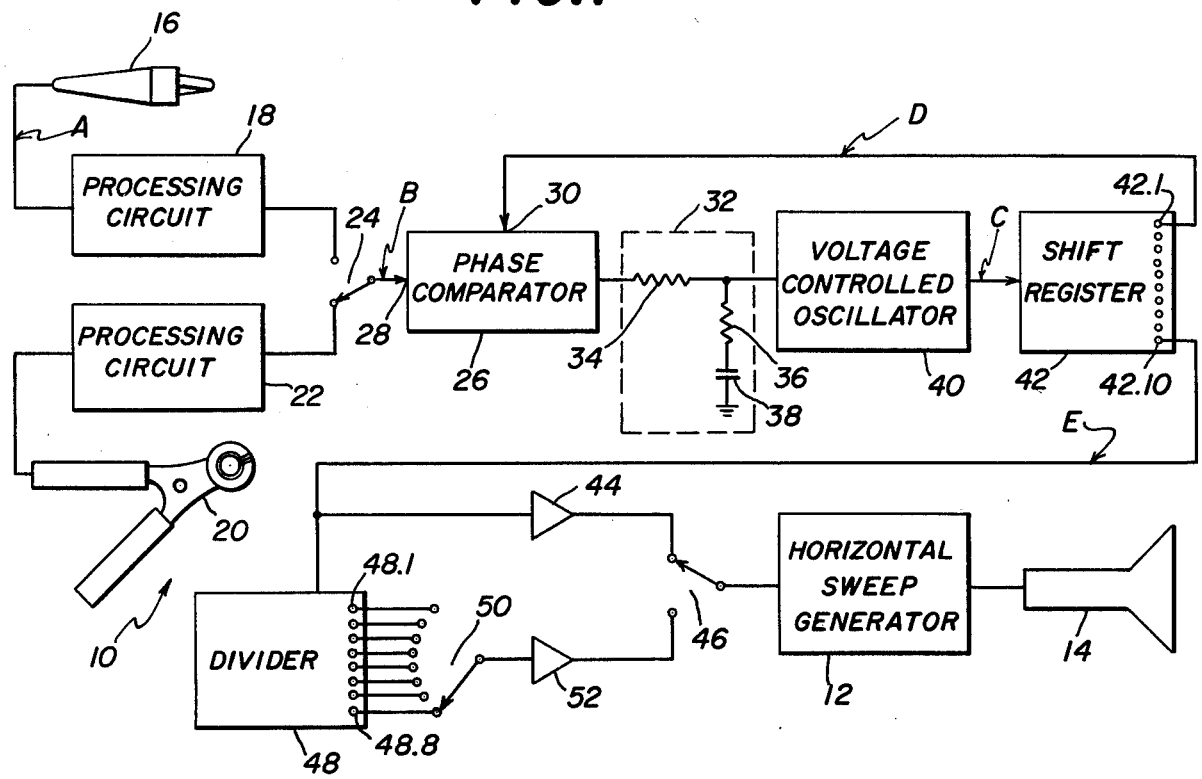
FIG. 1 is a diagram partially in schematic and partially in block showing a pretrigger circuit and associated oscilloscope elements incorporating the features of the present invention.

Referring now to the drawings, FIG. 1 depicts a trigger circuit 10 for triggering a horizontal sweep generator 12 which in turn produces the horizontal sweep for a cathode ray tube 14. A probe 16 is adapted to be clipped on the "points" side of the primary winding of the ignition coil (not shown). The ignition signal appearing on the primary winding is shown in the wave form of FIG. 2A. The ignition signal is converted into a square wave as shown in FIG. 2B by the processing circuit 18. A capacitive pickup device 20 is fitted over the wire leading to the "hot" side of the secondary of the ignition coil. The ignition signal appearing on the secondary is similar to the wave form shown in FIG. 2A. The ignition signal on the secondary is converted into a square wave, shown in FIG. 2B, by means of a processing circuit 22.

With the switch 24 in the position shown in FIG. 1, the horizontal sweep is triggered by ignition signals appearing on the secondary of the ignition coil, while in the other position of the switch 24, the horizontal sweep is triggered by ignition signals appearing on the coil's primary. Normally the signals obtained from the primary are more reliable and therefore most often the switch will be in the position opposite that shown in FIG. 1. However, in certain instances, it may be desirable to use the secondary ignition signal for triggering. Because the triggering circuit 10 employs a phase-locked loop which examines only the leading edges of the ignition signals, either of the ignition signals may be employed. The leading edges of the ignition signals on the primary winding and on the secondary winding are in time coincidence. The fact that the character of the signals may differ has virtually no effect on the circuit's performance.

The processing circuits 18 and 22 are connected to the terminals of a double pole switch 24, the movable arm being connected to a phase comparator 26. The phase comparator 26 generates a control signal representative of the difference in phase and frequency of two signals respectively applied to its inputs 28 and 30. The phase comparator 26 is coupled to a low-pass filter 32 having a series resistor 34 and the shunt combination of a resistor 36 and capacitor 38. Rapid fluctuations in the control signal produced by the phase comparator 26 as the result of rapid changes in engine speed are blocked by the low-pass filter 32. In an operative form of the invention, each of the resistors 34 and 36 had a value of 100K ohms, and the capacitor 38 had a value of 1 microfarad.

The trigger circuit 10 further comprises a voltage-controlled oscillator 40 which produces a sequence of oscillator pulses within a range of frequencies generally centered at N times the frequency of the ignition signals. The pulses are shown in FIG. 2C. In the particular embodiment shown in FIG. 1, N is equal to 10, as will be explained. In an 8-cylinder engine operating between 300 rpm and 10,000 rpm, the frequency of the ignition signals (shown in FIG. 2A) would be from 20 to 667 Hz. With "N" equal to 10, the pulses from the oscillator 40 would have a frequency of between 200 and 6,670 Hz.

When the control signal from the phase comparator 26 has its minimum amplitude, the frequency of the pulses from the voltage-controlled oscillator 40 is at a minimum. As the control voltage increases, the frequency of the oscillator pulses also increases.

The phase comparator 26 is an edge-controlled digital memory network. It consists of four flip-flop stages, control gating, and a three-stage output circuit comprising p- and n-type having a common output node. When the p-MOS or n-MOS drivers are on they pull the output up to the B+ supply voltage or down to ground voltage, respectively. This type of phase comparator acts only on the positive leading edges of the signals at the inputs 28 and 30. The duty cycles of the signals at these two inputs are not important since positive transitions control. If the frequency of the signal at the input 28 is higher than the frequency of the signal at the input 30, the p-type output driver is maintained on continuously. If the frequency of the signal at the input 28 is lower than the frequency of the signal at the input 30, the n-type output driver is maintained on continuously. If both frequencies are the same, but the signal at the input 28 lags the signal at the input 30, the n-type output driver is maintained on for a time corresponding to the phase difference, and conversely if the signal at the input 30 lags the signal at the input 28, the p-type driver is maintained on for a time corresponding to the phase difference. In this manner, the voltage across the capacitor 38 is adjusted until the signals at the inputs 28 and 30 are equal in both phase and frequency. At this stable point, both p- and n-type output drivers remain off and thus the output of the phase comparator 26 becomes an open circuit and holds the voltage on the capacitor 38 constant.

In a particular embodiment of the invention, the phase comparator 26 and the voltage-controlled oscillator 40 were part of a single integrated circuit made by RCA under its designation CD4046A and identified as "COS/MOS Micropower Phase-Locked Loop".

Figure 2:
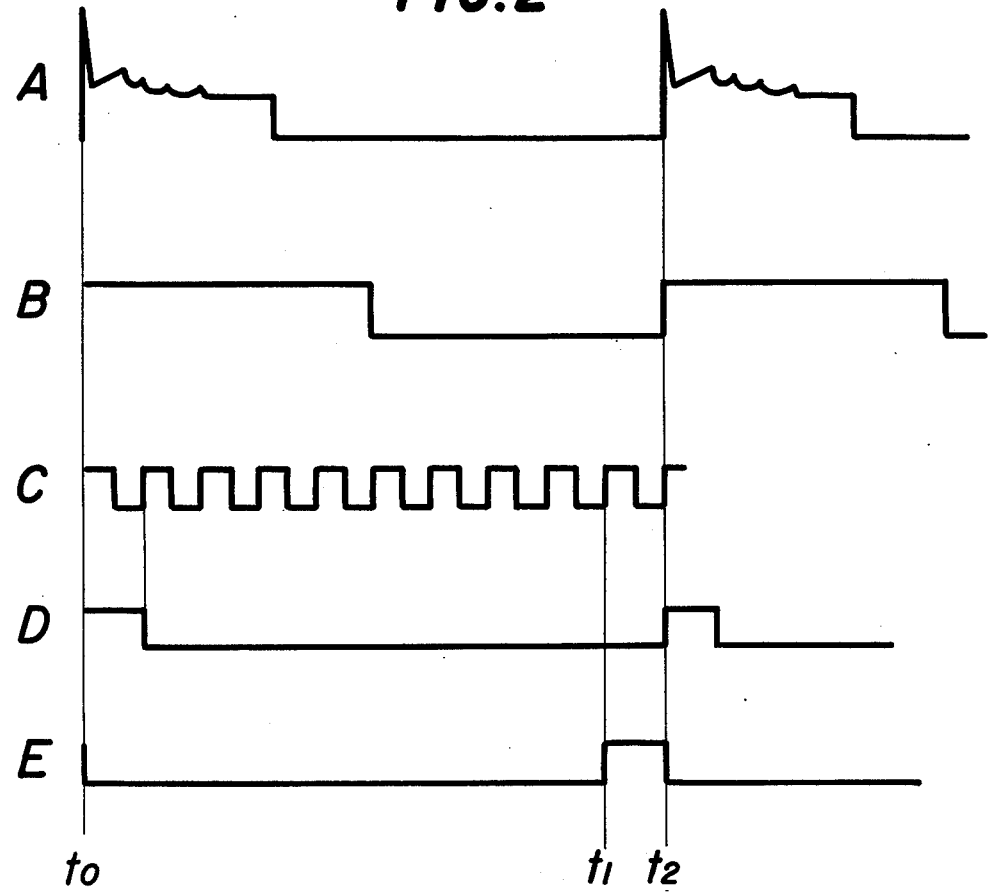
FIG. 2 depicts wave forms at various points in the circuit of FIG. 1 as indicated by the capital letters and arrows.

The trigger circuit 10 also includes a shift register 42 having a clock input coupled to the voltage-controlled oscillator 40 and N shift-register outputs, which, in the example illustrated in FIG. 1, is 10. The outputs are labeled 42.1–42.10. The first output 42.1 of the shift register 42 is coupled to the second input 30 of the phase comparator 26. The sequence of oscillator pulses from the voltage-controlled oscillator 40 respectively causes the shift register 42 to generate output pulses sequentially on the shift register outputs 42.1–42.10. The signal on the first output 42.1 is shown in FIG. 2D while the signal on the tenth output 42.10 is shown in FIG. 2E. As can be seen, the first pulse from the oscillator 40 (FIG. 2C) causes the first output 42.1 of the shift register 42 to become high and stay high until commencement of the second pulse from the oscillator 40. At that time the output 42.1 reverts to its normal low state. Although not shown in FIG. 2, the second 42.2 becomes high with the commencement of the second pulse of the voltage-controlled oscillator 40 and remains high until the commencement of the third pulse from the oscillator 40. The outputs 42.1–42.10 will sequentially become high in this manner. The tenth output 42.10 will become high upon commencement of the tenth pulse at $t_1$ and will remain high until the cycle starts all over and the eleventh pulse from the oscillator 40 is produced at $t_2$. The shift register 42 may be a device made by RCA and identified as CD4017A and identified as "COS/MOS Decade Counter/Divider".

As can be seen, when the trigger circuit 10 has reached its steady state condition, the frequency of the pulses on the output 42.1 (FIG. 2D) is the same as the frequency of the ignition signals (FIG. 2A) and the rise times of these signals are in phase. If the frequency of the ignition signals increases, the control voltage to the voltage-controlled oscillator 40 will also increase thereby increasing the frequency of the oscillator pulses therefrom, which in turn increases the frequency of the pulses on the output 42.1 until the frequencies of the ignition signal and the pulses on the output 42.1 are equal and in phase. Similarly, if the engine speed is reduced, the frequency of the ignition signals is reduced, causing the frequency of the signal on the output 42.1 ultimately to be changed to be the same as that of the ignition signals.

The combination of the phase comparator 26, the low-pass filter 32, the voltage-controlled oscillator 40, and the shift register 42 is a phase-locked loop in which the phase and frequency of the signals at the input 28 and the output 42.1 are the same.

The output 42.10 of the shift register 42 is coupled through a buffer amplifier 44 to one fixed contact of a double throw switch 46. In the position of such switch illustrated in FIG. 1, the pulses from the shift register 42 are coupled to the sweep generator 12. Each such pulse initiates a horizontal sweep across the cathode ray tube 14. Referring to FIG. 2, the horizontal sweep is triggered at $t_1$. However, as can be seen in FIG. 2A, the ignition signal does not commence until $t_2$, so that the sweep starts before the ignition signal starts and all the useful information in and about the commencement of the ignition signal will be clearly displayed on the cathode ray tube 14. This is in distinction to the common practice of triggering the sweep at $t_0$ and $t_2$, that is, at the beginning of an ignition signal, which undesirably causes information occurring at that time to be lost.

In the position of the switch shown in FIG. 1, the cathode ray tube 14 will display a raster (assuming a staircase signal is applied to the vertical input), that is, a number of separate wave forms corresponding to the number of cylinders. For example, in an eight-cylinder car, eight wave forms in substantial vertical alignment will appear respectively corresponding to the ignition signals of the eight cylinders. Because the horizontal sweep is started before the ignition signals occur, the entire raster will be moved to the right.

The output 42.10 is also coupled to a divider 48 which has eight outputs 48.1 corresponding to the eight cylinders of an automobile. The outputs 48.1–48.8 are coupled to eight fixed contacts of a rotary switch 50, the movable arm of which is coupled through a buffer amplifier 52 to the switch 46. When the switch 46 is moved to the second position, the divider 48 is in circuit in order that the cathode ray tube 14 will display a parade rather than a raster. In a parade-type display, the ignition signals of the eight cylinders appear one after another. The position of the switch 50 determines which ignition signal of which cylinder will be first. Thus, in the position shown, the ignition signal corresponding to the eighth cylinder will appear first followed by the ignition signal of the first cylinder, and so forth. If the switch were moved to the contact which is connected to the output 48.3, then the ignition signal corresponding to the third cylinder would appear first and the display followed sequentially by the fourth, fifth, sixth, seventh, eighth, first, second and third ignition signals. The divider is furnished with reset circuitry so that the circuit 10 can be used when the engine has less than eight cylinders, such as six, four or two. If, for example, the circuit 10 was used to analyze an engine with six cylinders, then the divider 48 would be reset upon completion of the sixth pulse. With the parade-type display, initiation of a horizontal sweep will occur prior to the ignition signal, so that again the display is moved toward the right so as not to lose any useful information at the beginning of the signal.

Although the particular embodiment of FIG. 1 shows the output 42.10 of the shift register 42 being used, any other output could be used to obtain a different amount of pretrigger. Using the output 42.10, the sweep is pre-triggered by an amount equal to 10% of the angle between ignition signals. In an eight-cylinder engine, there are 45° between the ignition signals and, therefore, the pretrigger would be 4.5°. In a six-cylinder engine, there are 60° between ignition signals, so that the amount of pretrigger, when the output 42.10 is employed, is 6°. If the output 42.5 were employed, for example, then the display on the cathode ray tube 14 would commence approximately in the center and the sweep would start 27° before the ignition pulse in an eight-cylinder engine and 30° before in a six-cylinder engine.

It is to be noted that the angular quantity of pretrigger is the same irrespective of engine speed whether the engine speed is 300 or 10,000 rpm. For example, if the output 42.10 is used, the sweep will start 4.5° before the ignition signal. Thus, the commencement of the trace on the cathode ray tube will not be dependent on engine speed.

An advantage in selecting the tenth output 42.10 is that the amount of pretrigger is only 4.5° in an eight-cylinder engine, which is enough so that useful information at the beginning of the ignition signal is not lost, yet is not so much that the mechanic is confused by the distance between the left-hand side of the cathode ray tube screen and the initiation of the ignition signal.

The invention is particularly significant when it is desired to display a raster in which only one of the ignition signals for eight cylinders appears on the cathode ray tube and any information lost at the beginning of the ignition signal is not visible anywhere else. However, the invention has significance even with the parade-type display, because even though the mechanic can select the position of the switch 50 so that the ignition signal for the particular cylinder under consideration is not at the left-hand side and therefore is no lost information, the graticule which has the necessary marking measurements is only suitable for analyzing the first or left-hand most ignition signal on the cathode ray tube.

What has been described, therefore, is a pretrigger circuit for the horizontal sweep generator of a cathode ray tube used in analyzing engine performance. This pretrigger circuit automatically takes into account variations in engine speed so that the display of the ignition signals will commence at the same point on the cathode ray tube whether the engine is operating at the low end of its speed range or at the high end. Furthermore, the pretrigger circuit is adjustable so that the amount of pretrigger can be selected. It can be any number of degrees desired. Also, such circuit does not depend on the characteristics of the ignition signals other than their leading edges. Thus, if the dwell of the engine changes so as to modify the character of the ignition signals, that will not affect the performance of the pretrigger circuit. Also, it enables use of the ignition signal on either the primary or the secondary of the ignition coil.

I claim:

1. A pretrigger circuit for the horizontal-sweep generator of an oscilloscope which is used to display ignition signals of an internal combustion engine, said trigger circuit comprising phase-comparator means having first and second inputs and an output, said first input being connected to receive the ignition signals, said phase-comparator means generating a control voltage representative of the difference in phase and frequency of two signals respectively applied to said first and second inputs, voltage-controlled oscillator means coupled to the output of said phase-comparator means for producing a sequence of oscillator pulses at a frequency within a range of frequencies generally centered at N times the frequency of the ignition signals, the frequency of the oscillator pulses being controlled by the value of said control voltage, and shift-register means having an input coupled to said voltage-controlled oscillator means and N shift-register outputs, one of said shift-register outputs being coupled to said second input of said phase-comparator means and another of said shift-register outputs being coupled to the horizontal-sweep generator, the sequence of oscillator pulses respectively causing said shift-register means to generate output pulses sequentially on said shift-register outputs, whereby the output pulses on said one shift-register output are at the same frequency as said ignition and are in phase therewith, and the output pulses on said other shift-register output are at the same frequency as said ignition signals but not in phase therewith so that horizontal sweeps of the oscilloscope commence at a selected point between the starts of the ignition signals.

2. The pretrigger circuit of claim 1, and further comprising a low-pass filter between said phase-comparator means and said voltage-controlled oscillator means for preventing rapid fluctuations in said control signal from affecting the frequency of the oscillator pulses.

3. The pretrigger circuit of claim 1, wherein N is equal to 10.

4. The pretrigger circuit of claim 1, wherein said other shift-register output is the last of said N shift-register outputs.

5. The pretrigger circuit of claim 1, wherein N is 10 and said other shift-register output is the last of said N shift-register outputs, whereby horizontal sweeps of the oscilloscope commence 10% earlier than the start of the ignition signals.

6. The pretrigger circuit of claim 1, and further comprising a processing circuit for converting the ignition pulses into rectangular waves prior to application to said phase-comparator means.

7. The pretrigger circuit of claim 1, and further comprising divider means coupled between said shift-register means in the horizontal-sweep generator for dividing the frequency of the shift-register pulses on said other output by the number of cylinders in the engine under test.

8. The pretrigger circuit of claim 1, wherein said phase-comparator means compares the phase and frequencies of the leading edges of the two signals applied to said first and second inputs.

9. A pretrigger circuit for the horizontal-sweep generator of an oscilloscope which is used to display ignition signals either on the primary winding or the secondary winding of the ignition coil in the ignition system of an internal-combustion engine, said trigger circuit comprising first means for providing ignition signals appearing on the primary winding of the ignition coil, second means for providing ignition signals appearing on the secondary winding of the ignition coil, switch means coupled to said first and second means for selectively providing either the ignition signals on the primary winding or the ignition signals on the secondary winding, phase-comparator means having first and second inputs and an output, said first input being coupled to receive the ignition signals from said switch means, said phase-comparator means generating a control voltage representative of the difference in phase and frequency of two signals respectively applied to said first and second inputs, voltage-controlled oscillator means coupled to the output of said phase-comparator means for producing a sequence of oscillator pulses at a frequency within a range of frequencies generally centered at N times the frequency of the ignition signals, the frequency of the oscillator pulses being controlled by the value of said control voltage, and shift-register means having an input coupled to said voltage-controlled oscillator means and N shift-register outputs, one of said shift-register outputs being coupled to said second input of said phase-comparator means and another of said shift-register outputs being coupled to the horizontal-sweep generator, the sequence of oscillator pulses respectively causing said shift-register means to generate output pulses sequentially on said shift-register outputs, whereby the output pulses on said shift-register output are at the same frequency as said ignition signals and are in phase therewith, and the output pulses on said other shift-register output are at the same frequency as said ignition signals but not in phase therewith so that horizontal sweeps of the oscilloscope commence at a selected point between the starts of the ignition signals.

* * * * *

UNITED STATES PATENT AND TRADEMARK OFFICE
CERTIFICATE OF CORRECTION

PATENT NO. : 4,129,828
DATED : December 12, 1978
INVENTOR(S) : James A. Jindrick It is certified that error appears in the above—identified patent and that said Letters Patent are hereby corrected as shown below:

Column 4, line 33, after "second" insert -- output -- .

Column 7, line 5, after "ignition" insert -- signals -- .

Signed and Sealed this

Seventeenth Day of April 1979

[SEAL]

Attest:

RUTH C. MASON
Attesting Officer

DONALD W. BANNER
Commissioner of Patents and Trademarks